US007907680B2

(12) United States Patent
Tsai et al.

(10) Patent No.: US 7,907,680 B2
(45) Date of Patent: Mar. 15, 2011

(54) TOLERABLE SYNCHRONIZATION CIRCUIT OF RDS RECEIVER

(75) Inventors: Tien-Ju Tsai, Tainan County (TW); Chih-Feng Lin, Tainan County (TW); Shih-Chuan Lu, Tainan County (TW)

(73) Assignee: Himax Technologies Limited, Fonghua Village, Sinshih Township, Tainan County (TW)

( * ) Notice: Subject to any disclaimer, the term of this patent is extended or adjusted under 35 U.S.C. 154(b) by 662 days.

(21) Appl. No.: 11/968,659

(22) Filed: Jan. 3, 2008

(65) Prior Publication Data

US 2009/0175385 A1 Jul. 9, 2009

(51) Int. Cl.
*H03K 9/00* (2006.01)
*H04L 27/00* (2006.01)

(52) U.S. Cl. ......... 375/316; 375/324; 375/326; 375/340

(58) Field of Classification Search .................. 375/316, 375/326, 324, 340
See application file for complete search history.

(56) References Cited

U.S. PATENT DOCUMENTS

| | | | | |
|---|---|---|---|---|
| 5,507,024 A * | 4/1996 | Richards, Jr. | ................. | 455/260 |
| 6,868,129 B2 * | 3/2005 | Li et al. | .......................... | 375/324 |
| 2007/0047737 A1 * | 3/2007 | Lerner et al. | .................... | 381/22 |

* cited by examiner

*Primary Examiner* — Ted M Wang
(74) *Attorney, Agent, or Firm* — Winston Hsu; Scott Margo

(57) ABSTRACT

A Radio Data System (RDS) decoder circuit determines a subcarrier frequency utilizing only a 57 kHz RDS signal of an FM broadcast signal. The RDS decoder includes a zero-intermediate frequency (zero-IF) FM demodulator, a first mixer, a low-pass filter (LPF) unit, a shaping filter unit, a carrier recovery circuit, a digitally controlled oscillator (DCO), a symbol timing recovery circuit, an integrate and dump circuit, a slicer 280, and a differential decoder. The carrier recovery circuit includes a phase error detector and a digital loop filter (DLF). The symbol timing recovery circuit includes a zero-crossing detector, a phase detector and loop filter unit, and a counter.

18 Claims, 10 Drawing Sheets

| Counter | {0,0} | {0,1} | {0,2} | {0,3} | {0,4} | {0,5} | {0,6} | {0,7} | {1,0} | {1,1} | {1,2} | {1,3} | {1,4} | {1,5} | {1,6} | {1,7} |
|---|---|---|---|---|---|---|---|---|---|---|---|---|---|---|---|---|
| Phase Error | 0 | 1 | 2 | 3 | -4 | -3 | -2 | -1 | 0 | 1 | 2 | 3 | -4 | -3 | -2 | -1 |
| Zero Cross Mark | -1 | -1 | 0 | 0 | 0 | 1 | 1 | 1 | 1 | 1 | 0 | 0 | 0 | 0 | -1 | -1 |

FIG. 6

TOLERABLE SYNCHRONIZATION CIRCUIT OF RDS RECEIVER

BACKGROUND OF THE INVENTION

1. Field of the Invention

The present invention relates to a synchronization circuit of an RDS decoder, and more particularly, a subcarrier recovery circuit and symbol timing recovery circuit of an RDS decoder and related methods thereof.

2. Description of the Prior Art

Radio Data System (RDS) is a standard from the European Broadcasting Union for sending digital information using conventional FM (frequency modulation) radio broadcasts. Radio Broadcast Data System (RBDS) is the official name used for the North American version of RDS, but is also commonly referred to as RDS. The RDS system standardizes several types of information transmitted and uses a 57 kHz subcarrier, which was chosen for being the third harmonic (3×) of the 19 kHz pilot tone for FM stereo.

To decode the RDS signal, a typical radio receiver first locks onto the received pilot tone and then calculates the third harmonic of the pilot tone frequency (19 kHz) to find the RDS subcarrier frequency (57 kHz).

If the transmitter of the radio signal employs two separate modulators, however—that is, one FM modulator for the audio signal and another modulator for the RDS signal—the clock signal feeding to each modulator may be slightly different from one another. The undesired result is that the RDS subcarrier may not be exactly the third harmonic of the pilot tone. For example, if the pilot tone is substantially under the typical 19 kHz and the RDS subcarrier is slightly higher than the normal 57 kHz, a radio receiver may have difficulties locking onto the RDS subcarrier signal based on the received pilot tone. This difficulty is also possible when each modulator experiences differing frequency drift, particularly in opposite directions.

Consequently, the radio receivers experiencing the above problems will exhibit poorer reception of the RDS signal, and reduced performance in providing RDS data to the user.

SUMMARY OF THE INVENTION

It is therefore an objective of the present invention to solve the aforementioned problems utilizing only an RDS signal of an FM broadcast signal.

According to an exemplary embodiment of the claimed invention, a Radio Data System (RDS) decoder circuit is disclosed, wherein an RDS subcarrier frequency is determined utilizing only an RDS signal of an FM broadcast signal.

According to another exemplary embodiment of the claimed invention, a method of radio data system (RDS) decoding is disclosed, which includes determining an RDS subcarrier frequency utilizing only an RDS signal of an FM broadcast signal.

The foregoing has outlined rather broadly the features and technical advantages of the present invention in order that the detailed description of the invention that follows may be better understood. Additional features and descriptions of the present invention will be described hereinafter which form the subject of the claims of the present invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

For a more complete understanding of the present invention, and the advantages thereof, reference is now made to the following descriptions taken in conjunction with the accompanying drawings, in which:

FIG. 6 shows a table for counter values and corresponding phase error values and zero crossing values.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms “including” and “comprising” are used in an open-ended fashion, and thus should be interpreted to mean “including, but not limited to . . . ” The terms “couple” and “couples” are intended to mean either an indirect or a direct electrical connection. Thus, if a first device couples to a second device, that connection may be through a direct electrical connection, or through an indirect electrical connection via other devices and connections.

Figure 1:
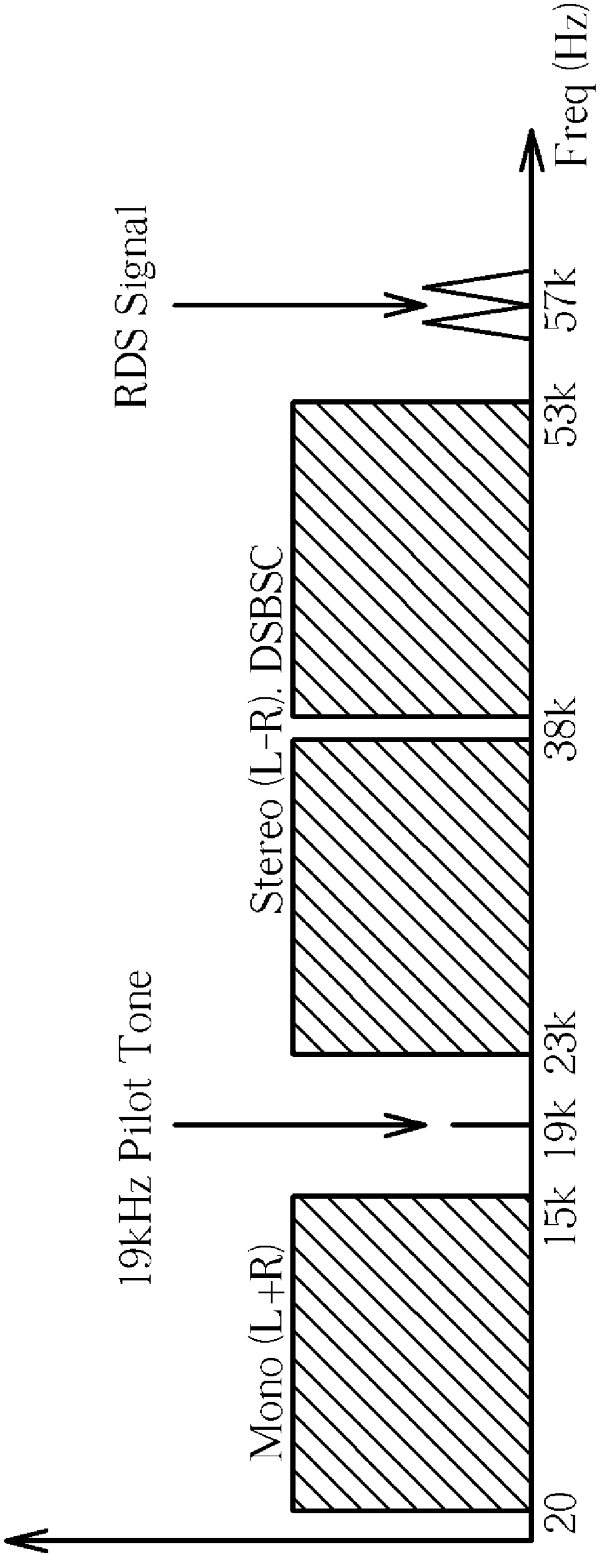
FIG. 1 RELATED ART
FIG. 1 shows a typical bandwidth diagram of frequency modulated (FM) broadcast spectrum.

FIG. 1 shows a typical bandwidth diagram of frequency modulated (FM) broadcast spectrum. Of particular note is that a 19 kHz pilot tone is utilized for stereo broadcast signals, located between the mono (L+R) and stereo (L−R) signal spectrums. As mentioned above, to decode the RDS signal, a typical radio receiver first locks onto the received pilot tone and then calculates the third harmonic of the pilot tone frequency (19 kHz) to find the RDS subcarrier frequency (57 kHz).

However, in order to obtain certain advantages that will be described in the following description, in the present invention, the RDS subcarrier frequency is directly determined without utilizing the 19 kHz stereo pilot tone of the FM broadcast signal. Consequently, the RDS decoder of the present invention will circumvent the above problems experienced by related art RDS decoders and radio receivers, and will exhibit better reception of the RDS signal as well as increased performance in providing RDS data to the user.

Figure 2:
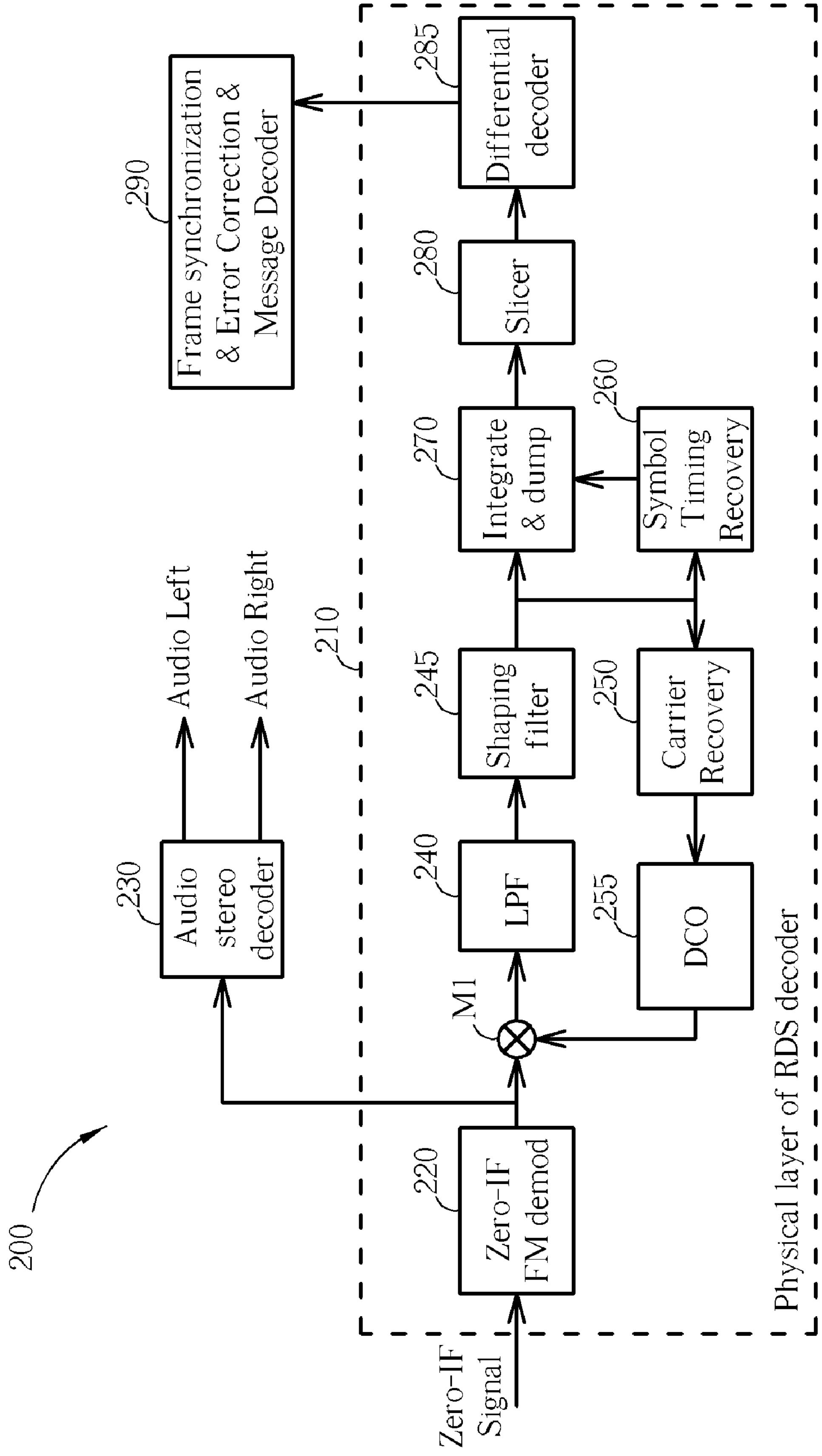
FIG. 2 is a block diagram of an RDS decoder of the present invention.

FIG. 2 is a block diagram of an RDS decoder of the present invention. The RDS decoder 200 comprises components in a physical layer 210 of the RDS decoder, an audio stereo decoder 230, and a frame synchronization, error correction, and message decoder unit 290. In the RDS decoder, the physical layer 210 comprises a zero-intermediate frequency (zero-IF) FM demodulator 220, a first mixer M1, a low-pass filter (LPF) unit 240, a shaping filter unit 245, a carrier recovery circuit 250, a digitally controlled oscillator (DCO) 255, a symbol timing recovery circuit 260, an integrate and dump circuit 270, a slicer 280, and a differential decoder 285.

As shown in FIG. 2, the zero-IF FM demodulator 220 receives a zero-IF signal. The audio stereo decoder 230 is coupled to the output of zero-IF FM demodulator 220 and outputs a left and right audio signal. The first mixer 225 has an input coupled to an output of the zero-IF FM demodulator and another input coupled to a feedback signal; the output of the first mixer M1 feeds to the input of the low-pass filter (LPF) unit 240. A shaping filter unit 245 is connected serially with the LPF 240, and has its input coupled to the output of the LPF 240. The output of the shaping filter unit 245 is connected to a carrier recovery circuit 250, a symbol timing recovery circuit 260, and an integrate and dump circuit 270. The carrier recovery circuit 250 has an input coupled to an output of the shaping filter unit 245. A digitally controlled oscillator (DCO) 255 connected in serial with the carrier recovery circuit 250 has an input coupled to an output of the carrier recovery circuit 250; the output of the DCO 255 outputs the feedback signal back to the input of the first mixer M1. The symbol timing recovery circuit 260 having an input coupled to the output of the shaping filter unit 245 outputs its signal to the integrate and dump circuit 270, which also has an input coupled to the output of the shaping filter unit 245. The output of the integrate and dump circuit 270 is connected to a slicer 280, which has its output connected to the differential decoder 285. Following the differential decoder 285, the frame synchronization, error correction, and message decoder unit 290 is connected serially.

Figure 3:
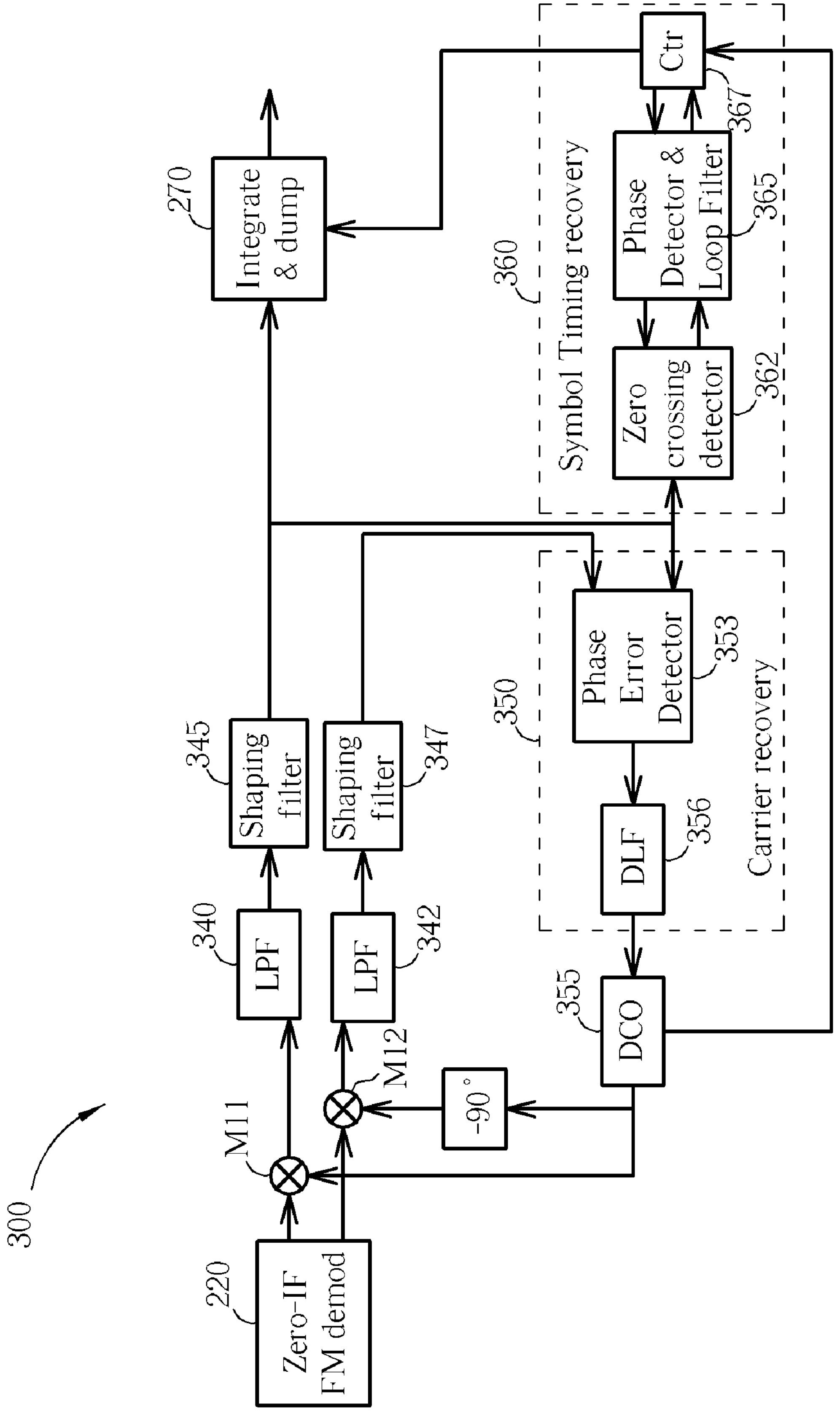
FIG. 3 shows a more detailed view of an embodiment of the RDS decoder physical layer.

Please refer to FIG. 3. The schematic 300 of FIG. 3 shows a more detailed view of an embodiment of the RDS decoder physical layer 200. In this figure, the output of zero-IF FM demodulator 220 is broken into an in-phase (I) and quadrature (Q) signal pair, and fed into a pair of first mixers M11 and M12. Likewise, a pair of low-pass filter units 340 and 342 is connected to the outputs of first mixers M11 and M12, respectively, and the outputs of the LPF units 340 and 342 are connected to the shaping filter units 345 and 347, respectively. The outputs of shaping filter units 345 and 347 are connected to the carrier recovery circuit 350. In this embodiment, however, only the output of shaping filter unit 345 is connected additionally to the input of the symbol timing recovery circuit 360 and to the input of the integrated and dump circuit 270.

In FIG. 3, the carrier recovery circuit 350 further includes a phase error detector 353 and a digital loop filter (DLF) 356 connected in series. The output of the DLF 356 is connected to DCO 355, which in turn is fed back to the first mixers M11 and M12. Please note that while the output of DCO 355 is connected directly to the first mixer M11, the same output signal first undergoes a −90° phase delay before connecting to the first mixer M12 as input.

The symbol timing recovery circuit 360 of FIG. 3 comprises a zero-crossing detector 362, a phase detector and loop filter unit 365, and a counter 367 connected in series. The zero-crossing detector 362 is connected to the output of the shaping filter 345, whereas the counter additionally receives a clock input from the output of the DCO 355 and outputs to the integrate and dump circuit 270.

Figure 4:
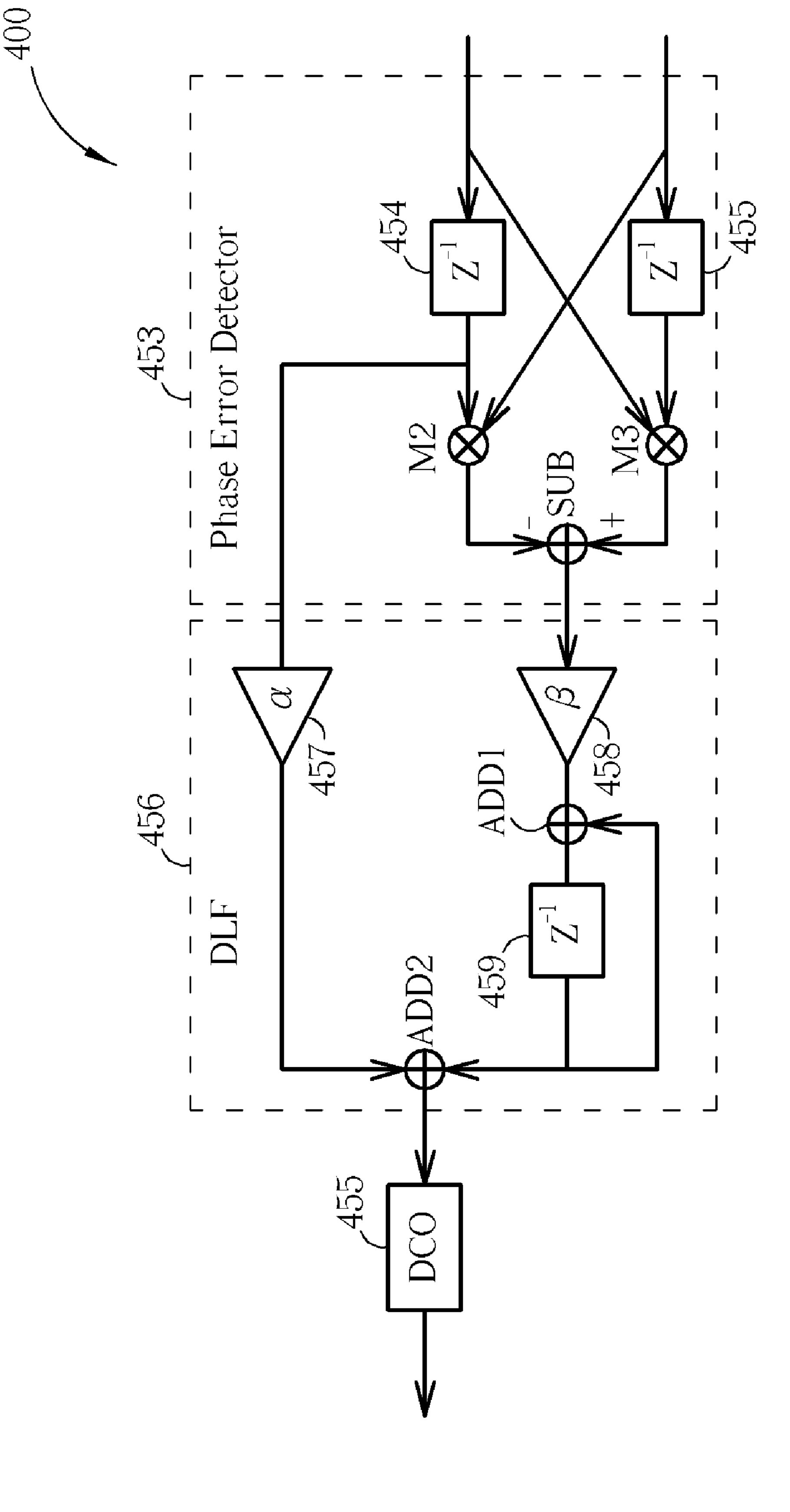
FIG. 4 provides an expanded view of the carrier recovery circuit of FIG. 3 in an embodiment of the present invention.

FIG. 4 provides an expanded view of the carrier recovery circuit of FIG. 3 in an embodiment of the present invention. In carrier recovery circuit 400, the phase error detector 453 comprises a first delay unit 454, a second delay unit 455, a second mixer M2, a third mixer M3, and a subtractor SUB. The first delay unit 454 is coupled to the output of the shaping filter 347 (shown in FIG. 3), and the second delay unit 455 is coupled to the output of the shaping filter 345 (shown in FIG. 3). The second mixer M2 has inputs coupled to the output of the first delay unit 454 and to the input of the second delay unit 455. Similarly, the third mixer M3 has inputs coupled to the output of the second delay unit 455 and to the input of the first delay unit 454, as shown in FIG. 4. The subtractor SUB is coupled to the output of the second mixer M2 and the output of the third mixer M3, and outputs a subtracted signal by subtracting the output of the second mixer M2 from the output of the third mixer M3. The two output signals from the phase error detector 453 to the digital loop filter (DLF) 456 are the output of the first delay unit 454 and the output of the subtractor SUB.

Continuing in FIG. 4, the digital loop filter (DLF) 456 comprises a first amplifier 457, a second amplifier 458, a first adder ADD1, a third delay unit 459, and a second adder ADD2. The first amplifier 457 has an input coupled to the output of the first delay unit 454. The input of the second amplifier 458 is coupled to the output of the subtractor SUB for amplifying the subtracted signal. The output of the second amplifier 458 is connected to an input of the first adder ADD1. The output of the first adder ADD1 is coupled to the input of the third delay unit 459, which has its output coupled to the input of the second adder ADD2. The third delay unit 459 also has its output coupled back to another input of the first adder ADD1. The second adder ADD2 is coupled to the output of the first amplifier 457 and the third delay unit 459, and generates an added signal to the DCO (not shown in FIG. 4).

As shown in the circuit of FIG. 3 and FIG. 4, the phase error detector 453 estimates a frequency error and phase error between an RDS transmitter and an RDS receiver according to the signal obtained after the LPFs 340, 342 and the shaping filters 345, 347. From the output of the shaping filters 345, 347, the carrier recovery circuit 400 obtains an in-phase component x(t) and a quadrature component y(t), where $m(t)=x(t)+jy(t)=re^{j\psi(t)}$ and $$re^{j(\psi(t)-\psi(t-1))}=\{[x(t)x(t-1)+y(t)y(t-1)]+j[y(t)x(t-1)-x(t)y(t-1)]\}/r$$

The RDS decoder according to this embodiment of the present invention estimates the frequency error according to the quadrature component $y(t)x(t-1)-x(t)y(t-1)$ [quadrature part of $re^{j(\psi(t)-\psi(t-1))}$]. Furthermore, the phase error is estimated according to $y(t-1)$ [quadrature part of $m(t-1)$].

Figure 5:
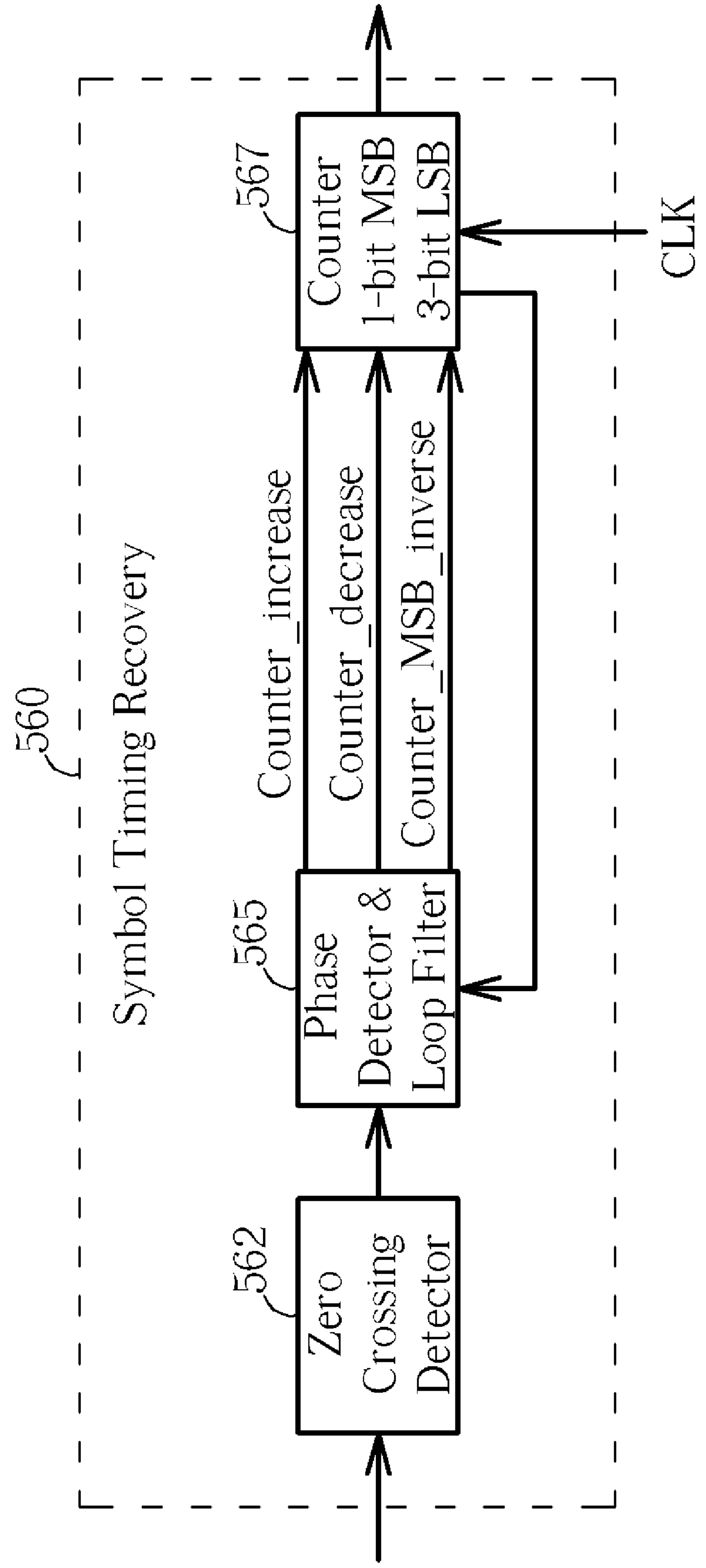
FIG. 5 provides an expanded view of the symbol timing recovery circuit of FIG. 3 in another embodiment of the present invention.

FIG. 5 provides an expanded view of the symbol timing recovery circuit 360 of FIG. 3 in another embodiment of the present invention. In FIG. 5, the symbol timing recovery circuit 560 comprises a zero-crossing detector 562, a phase detector and loop filter unit 565, and a counter 567 connected in series. The zero-crossing detector 562 has an input coupled to the output of the shaping filter unit (not shown in FIG. 5, but substantially the same as the shaping filter unit 345 of FIG. 3). The phase detector and loop filter unit 565 is connected to the output of the zero crossing detector 562. The counter 567 is coupled to the phase detector and loop filter unit 565, and has a clock input CLK coupled to the output of the DCO (not shown in FIG. 5), and has an output coupled to the integrate and dump circuit (also not shown in FIG. 5).

Of particular note in FIG. 5 are the connections between the phase detector and loop filter unit 565 and the counter 567. The output from the phase detector and loop filter unit 565 to the counter 567 includes three specific signals: a counter increase signal Counter_increase, a counter decrease signal Counter_decrease, and a counter most significant byte (MSB) inverse signal Counter_MSB_inverse. In addition, a counter value is outputted from the counter 567 back to the phase detector and loop filter unit 565.

In an embodiment of the RDS decoder of the present invention, the phase detector and loop filter unit 565 asserts one of each of the above signals depending upon the status of an accumulated phase error or accumulated zero crossing detected. When the accumulated phase error is less than a first predetermined threshold, the phase detector and loop filter unit 565 asserts the Counter_increase (the counter increase signal). When the accumulated phase error is greater than a second predetermined threshold (which may be different than the first predetermined threshold), the phase detector and loop filter unit 565 asserts Counter_decrease (the counter decrease signal). When the phase detector and loop filter unit 565 detects an accumulated zero crossing being less than zero, the phase detector and loop filter unit 565 asserts the counter most significant byte (MSB) inverse signal Counter_MSB_inverse.

The counter 567 utilizes a 19 kHz clock signal from the DCO (such as DCO 355 in FIG. 3) as an input clock signal CLK, which is derived from the detected RDS subcarrier frequency divided by 3. The counter 567 is in one embodiment of the symbol timing recovery circuit 560 configured to count to 16. Please refer to FIG. 6, which shows a table for counter values and corresponding phase error values and zero crossing values. As shown in FIG. 6, the counter counts from {0,0} to {0,7}, and then from {1,0} to {1,7}, for a total of 16 counts. Please note that although the counter 567 is presented in this description as counting to 16, it is a selection for illustration purposes only and is not intended as a limitation to the present invention.

The phase detector and loop filter unit 565 of the symbol timing recovery circuit 560 adjusts the symbol phase based on the counter values at symbol zero crossings. As shown in FIG. 6, the phase detector and loop filter unit 565 and counter 567 strive to adjust the symbol phase error to be as close to 0 as possible, which is ideally at counter values {0,0} and {1,0} in FIG. 6. Once a stably low phase error is obtained, the symbol timing recovery circuit 560 determines the symbol boundary by comparing the accumulated zero crossings at the {0,0} and {1,0}. For example, when the accumulated zero crossing at {1,0} is higher than the accumulated zero crossing at {0,0}, the phase error detector and loop filter unit 565 asserts the Counter_MSB_inverse signal. In this manner, if the counter 567 was at value {0,0}, its value becomes {1,0}; likewise, if the counter 567 was at value {1,0}, its value becomes {0,0}. In effect, the symbol boundary has been shifted substantially half of a symbol time length.

Figure 7:
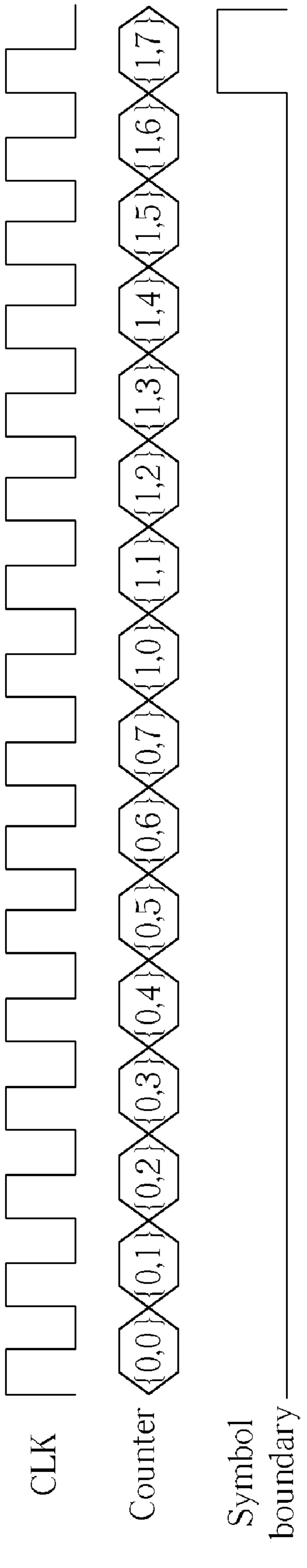
FIG. 7 shows a timing diagram for the counter with the 19 kHz clock.
Figure 8:
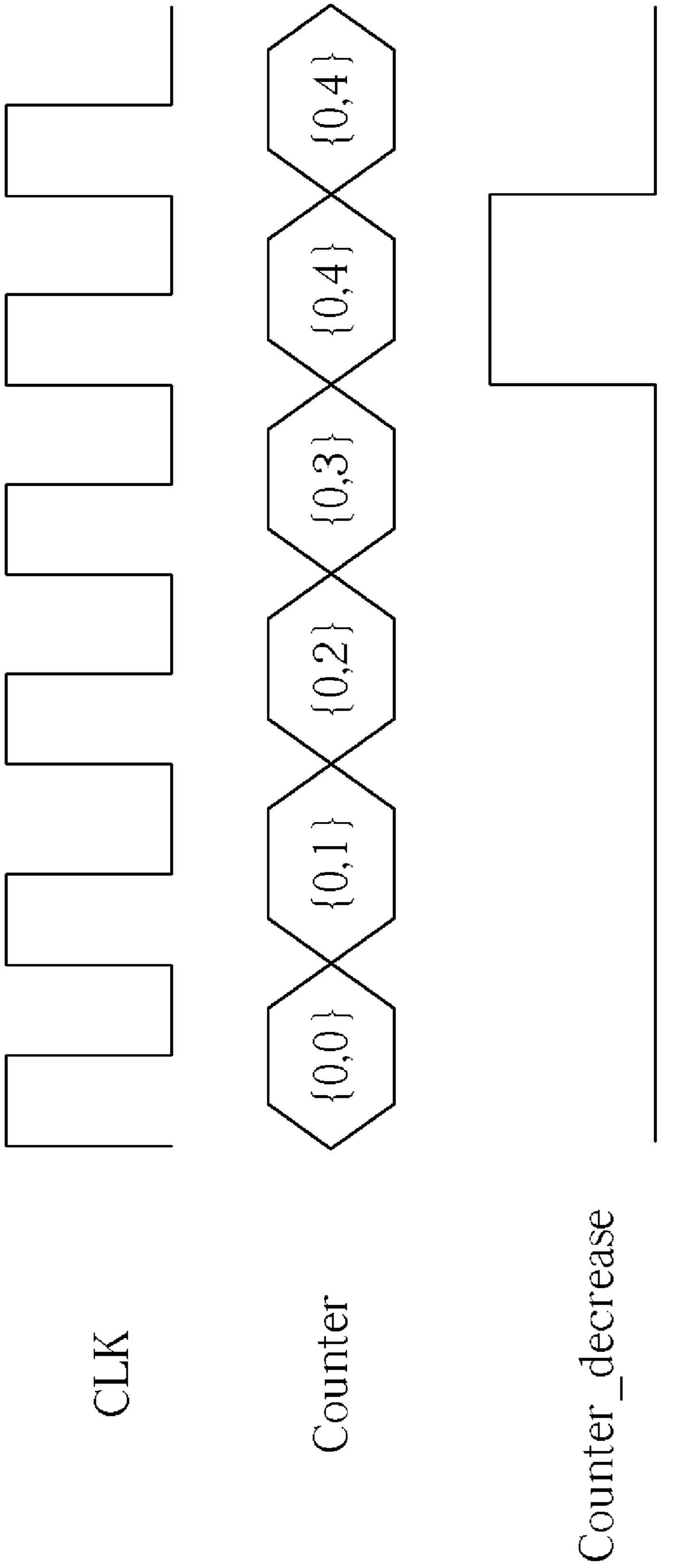
FIG. 8-10 show exemplary timing diagrams due to the assertion of the signals Counter_decrease, Counter_increase, and Counter_MSB_inverse, respectively, according to one implementation of the symbol timing recovery.
Figure 9:
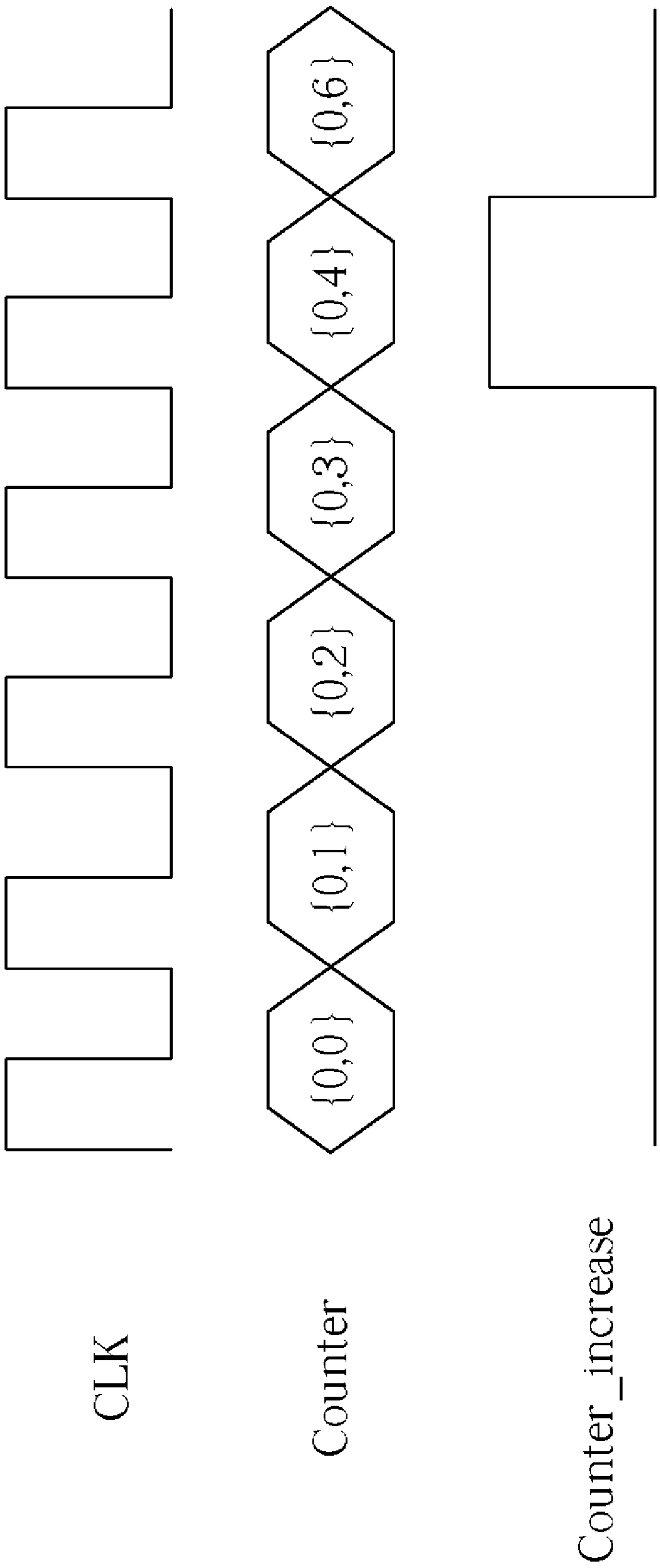
Figure 10:
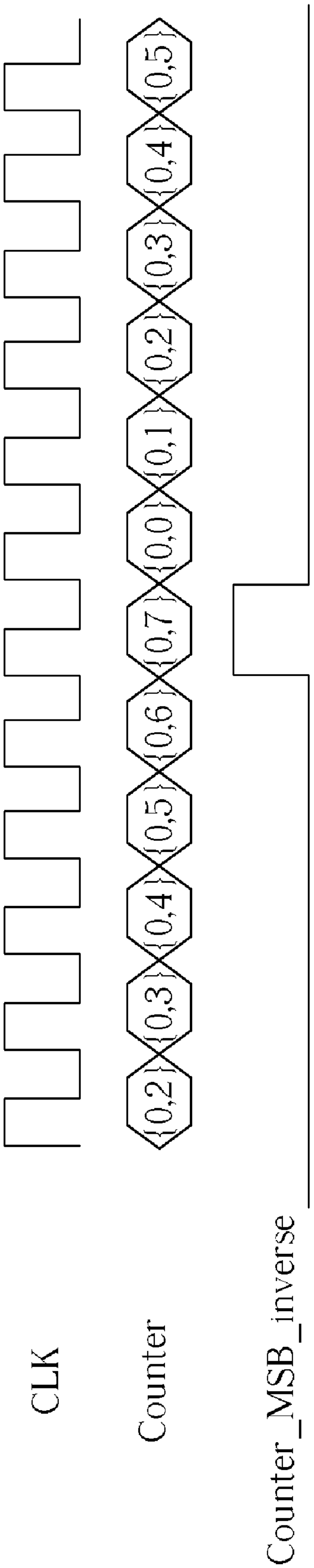

FIG. 7 shows a timing diagram for the counter 567 with the 19 kHz clock CLK, wherein the symbol boundary of the symbol timing recovery circuit 560 is at counter value {1,7}. In addition, FIGS. 8-10 show exemplary timing diagrams due to the assertion of the signals Counter_decrease, Counter_increase, and Counter_MSB_inverse, respectively, according to one implementation of the symbol timing recovery 560.

After reviewing the embodiments of the present invention, other applications and implementations will be obvious to those skilled in the art, and should be included within the scope of the present invention.

Please note that although the examples in this description have shown that symbol timing recovery circuit 560 is implemented using a counter for increasing, decreasing, and inverting the symbol boundary (as per Counter_MSB_Inverse), this is only intended for clarity of explanation and is not meant as a limitation to the present invention.

From the above description and embodiments, an radio data system (RDS) decoder is disclosed for determining an RDS subcarrier frequency without utilizing the stereo pilot tone of the FM broadcast signal, the stereo pilot tone being located substantially at 19 kHz. An added benefit to the present invention is that it can be implemented for use with monophonic FM broadcast signals, wherein the stereo pilot tone does not exist. Such an application should also be considered within the scope of the present invention.

Also, although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

Those skilled in the art will readily observe that numerous modifications and alterations of the device and method may be made while retaining the teachings of the invention.

What is claimed is:

1. A radio data system (RDS) decoder, comprising:

a zero-IF FM demodulator receiving a zero-IF signal;

a first mixer having an input coupled to an output of the zero-IF FM demodulator and a feedback signal;

a low-pass filter (LPF) unit having an input coupled to an output of the first mixer;

a shaping filter unit having an input coupled to an output of the LPF;

a carrier recovery circuit having an input coupled to an output of the shaping filter; and a digitally controlled oscillator (DCO) having an input coupled to an output of the carrier recovery circuit for outputting the feedback signal to the input of the first mixer;

wherein an RDS subcarrier frequency is determined utilizing only an RDS signal of an FM broadcast signal, and the carrier recovery circuit comprises:

a phase error detector having an input coupled the output of the shaping filter; and a digital loop filter (DLF) having an input coupled the output of the phase error detector and having an output coupled to the input of the DCO.

2. The RDS decoder of claim 1, wherein the RDS subcarrier frequency is determined utilizing only an RDS signal of the FM broadcast signal, the RDS signal being located substantially at 57 kHz.

3. The RDS decoder of claim 1, wherein the FM broadcast signal is a monophonic signal and a stereo pilot tone does not exist.

4. The RDS decoder of claim 1, wherein the carrier recovery circuit is for estimating frequency error according to:

$$y(t)x(t-1)-x(t)y(t-1)[\text{quadrature part of } re^{j(\psi(t)-\psi(t-1))}];$$

and for estimating phase error according to:

$$y(t-1)[\text{quadrature part of } m(t-1)].$$

5. The RDS decoder of claim 1, wherein the phase error detector further comprises:

a first delay unit having an input coupled to a first output of the shaping filter;

a second delay unit having an input coupled to a second output of the shaping filter;

a second mixer having inputs coupled to an output of the first delay unit and to the input of the second delay unit;

a third mixer having inputs coupled to an output of the second delay unit and to the input of the first delay unit; and a subtractor coupled to the output of the second mixer and the output of the third mixer for subtracting the output of the first mixer from the output of the third mixer to thereby generate a subtracted signal.

6. The RDS decoder of claim 5, wherein the DLF further comprises:

a first amplifier having an input coupled to the output of the first delay unit;

a second amplifier having an input coupled to the output of the subtractor for amplifying the subtracted signal;

a first adder having an input coupled to the output of the second amplifier and a delayed signal;

a third delay unit having an input coupled to the output of the first adder for outputting the delayed signal; and a second adder coupled to the output of the first amplifier and the delayed signal for adding the output of the first amplifier to the delayed signal to thereby generate an added signal to the DCO.

7. The RDS decoder of claim 1, further comprising:

a symbol timing recovery circuit having an input coupled to the output of the shaping filter;

an integrate and dump circuit having an input coupled to the output of the shaping filter and another input coupled to the output of the symbol timing recovery circuit;

a slicer having an input coupled to the output of the integrate and dump circuit;

a differential decoder having an input coupled to the output of the slicer; and a frame synchronization, error correction, and message decoder unit having an input coupled to the output of the differential decoder.

8. The RDS decoder of claim 7, wherein the symbol timing recovery circuit comprises:

a zero-crossing detector having an input coupled to the output of the shaping filter;

a phase detector and loop filter unit having an input coupled to the output of the zero crossing detector; and a counter coupled to the phase detector and loop filter unit, having a clock input coupled to the output of the DCO, and having an output coupled to the integrate and dump circuit.

9. The RDS decoder of claim 8, wherein the phase detector and loop filter unit asserts a counter increase signal when an accumulated phase error is less than a predetermined first threshold;

the phase detector and loop filter unit asserts a counter decrease signal when the accumulated phase error is greater than a predetermined second threshold;

the phase detector and loop filter unit asserts a counter most significant byte (MSB) inverse signal when an accumulated zero crossing is less than zero; and a counter value is outputted from the counter to the phase detector and loop filter unit.

10. A method of radio data system (RDS) decoding, comprising:

providing a zero-IF FM demodulator receiving a zero-IF signal;

providing a first mixer having an input coupled to an output of the zero-IF FM demodulator and a feedback signal;

providing a low-pass filter (LPF) unit having an input coupled to an output of the first mixer;

providing a shaping filter unit having an input coupled to an output of the LPF;

providing a carrier recovery circuit having an input coupled to an output of the shaping filter;

providing a digitally controlled oscillator (DCO) having an input coupled to an output of the carrier recovery circuit for outputting the feedback signal to the input of the first mixer; and determining an RDS subcarrier frequency utilizing only an RDS signal of an FM broadcast signal;

wherein the carrier recovery circuit comprises:

a phase error detector having an input coupled the output of the shaping filter; and a digital loop filter (DLF) having an input coupled the output of the phase error detector and having an output coupled to the input of the DCO.

11. The method of claim 10, further comprising:

determining the RDS subcarrier frequency utilizing only an RDS signal of the FM broadcast signal, the RDS signal being located substantially at 57 kHz.

12. The method of claim 10, wherein the FM broadcast signal is a monophonic signal and a stereo pilot tone does not exist.

13. The method of claim 10, further comprising:

utilizing the carrier recovery circuit for estimating frequency error according to:

$$y(t)x(t-1)-x(t)y(t-1)[\text{quadrature part of } rej(\psi(t)-\psi(t-1))];\text{ and}$$

estimating phase error according to:

$$y(t-1)[\text{quadrature part of } m(t-1)].$$

14. The method of claim 10, wherein the phase error detector further comprises:

a first delay unit having an input coupled to a first output of the shaping filter;

a second delay unit having an input coupled to a second output of the shaping filter;

a first mixer having inputs coupled to an output of the first delay unit and to the input of the second delay unit;

a second mixer having inputs coupled to an output of the second delay unit and to the input of the first delay unit; and a subtractor coupled to the output of the first mixer and the output of the second mixer for subtracting the output of the first mixer from the output of the second mixer to thereby generate a subtracted signal.

15. The method of claim 14, wherein the DLF further comprises:

a first amplifier having an input coupled to the output of the first delay unit;

a second amplifier having an input coupled to the output of the subtractor for amplifying the subtracted signal;

a first adder having an input coupled to the output of the second amplifier and a delayed signal;

a third delay unit having an input coupled to the output of the first adder for outputting the delayed signal; and a second adder coupled to the output of the first amplifier and the delayed signal for adding the output of the first amplifier to the delayed signal to thereby generate an added signal to the DCO.

16. The method of claim 10, further comprising:

providing a symbol timing recovery circuit having an input coupled to the output of the shaping filter;

providing an integrate and dump circuit having an input coupled to the output of the shaping filter and another input coupled to the output of the symbol timing recovery circuit;

providing a slicer having an input coupled to the output of the integrate and dump circuit;

providing a differential decoder having an input coupled to the output of the slicer; and providing a frame synchronization, error correction, and message decoder unit having an input coupled to the output of the differential decoder.

17. The method of claim 16, wherein the symbol timing recovery circuit comprises:

a zero-crossing detector having an input coupled to the output of the shaping filter;

a phase detector and loop filter unit having an input coupled to the output of the zero crossing detector; and a counter coupled to the phase detector and loop filter unit, having a clock input coupled to the output of the DCO, and having an output coupled to the integrate and dump circuit.

18. The method of claim 17, further comprising:

asserting a counter increase signal utilizing the phase detector and loop filter unit when an accumulated phase error is less than a predetermined first threshold;

asserting a counter decrease signal utilizing the phase detector and loop filter unit when the accumulated phase error is greater than a predetermined second threshold;

asserting a counter most significant byte (MSB) inverse signal utilizing the phase detector and loop filter unit when an accumulated zero crossing is less than zero; and outputting a counter value from the counter to the phase detector and loop filter unit.

* * * * *